US006579662B1

(12) United States Patent
Zheng et al.

(10) Patent No.: US 6,579,662 B1
(45) Date of Patent: Jun. 17, 2003

(54) THERMAL SWITCHABLE COMPOSITION AND IMAGING MEMBER CONTAINING COMPLEX OXONOL IR DYE AND METHODS OF IMAGING AND PRINTING

(75) Inventors: Shiying Zheng, Webster, NY (US); Kevin W. Williams, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 97 days.

(21) Appl. No.: 09/947,112

(22) Filed: Sep. 5, 2001

(51) Int. Cl.[7] .................................... G03F 7/038

(52) U.S. Cl. .................... 430/281.1; 430/278.1; 430/286.1; 430/302; 430/348; 430/944; 430/945; 430/964; 101/453; 101/457; 101/465; 101/467

(58) Field of Search .................. 430/270.1, 278.1, 430/281.1, 286.1, 287.1, 288.1, 302, 303, 348, 944, 945, 964; 8/654–688; 101/453, 457, 465, 467

(56) References Cited

U.S. PATENT DOCUMENTS

| | | | | |
|---|---|---|---|---|
| 4,693,958 A | | 9/1987 | Schwartz et al. | 430/302 |
| 5,512,418 A | | 4/1996 | Ma | 430/271.1 |
| 5,985,574 A | | 11/1999 | King et al. | 435/6 |
| 6,146,812 A | | 11/2000 | Leon et al. | 430/270.1 |
| 6,159,657 A | | 12/2000 | Fleming et al. | 430/270.1 |
| 6,159,673 A | * | 12/2000 | Nishigaki et al. | 430/512 |
| 6,190,830 B1 | | 2/2001 | Leon et al. | 430/270.1 |
| 6,190,831 B1 | | 2/2001 | Leon et al. | 430/270.1 |
| 6,248,886 B1 | | 6/2001 | Williams et al. | 544/106 |
| 6,248,893 B1 | | 6/2001 | Williams et al. | 546/347 |
| 6,410,202 B1 | | 6/2002 | Fleming et al. | 430/270.1 |
| 6,423,469 B1 | * | 7/2002 | DoMinh et al. | 430/270.1 |
| 2002/0009669 A1 | * | 1/2002 | Morishima et al. | 430/270.18 |

FOREIGN PATENT DOCUMENTS

| | | |
|---|---|---|
| DE | 100 42 293 A1 | 3/2001 |
| EP | 0 652 383 A1 | 5/1995 |
| GB | 2 358 710 A | 8/2001 |

* cited by examiner

*Primary Examiner*—Rosemary Ashton
*Assistant Examiner*—Barbara Gilliam
(74) *Attorney, Agent, or Firm*—J. Lanny Tucker

(57) ABSTRACT

An imaging member, such as a negative-working printing plate or on-press cylinder, can be prepared with a hydrophilic imaging layer comprised of a heat-sensitive hydrophilic charged polymer (ionomer) and an infrared radiation sensitive negatively-charged oxonol dye that has a $\lambda_{max}$ of greater than 700 nm. The heat-sensitive polymer and IR dye can be formulated in water or water-miscible solvents to provide highly thermal sensitive imaging compositions. In the imaging member, the polymer reacts to provide increased hydrophobicity in areas exposed to energy that provides or generates heat. For example, heat can be supplied by laser irradiation in the IR region of the electromagnetic spectrum. The heat-sensitive polymer is considered "switchable" in response to heat, and provides a lithographic image without conventional alkaline processing.

28 Claims, No Drawings

THERMAL SWITCHABLE COMPOSITION AND IMAGING MEMBER CONTAINING COMPLEX OXONOL IR DYE AND METHODS OF IMAGING AND PRINTING

FIELD OF THE INVENTION

This invention relates in general to thermal imaging compositions and to imaging members (particularly lithographic printing plates) prepared therefrom. The invention also relates to a method of imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are becoming more common. Examples of such plates are described in U.S. Pat. No. 5,372,915 (Haley et al.). They include an imaging layer comprising a mixture of dissolvable polymers and an infrared radiation-absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}$YAG laser. The absorbing layer converted the infrared energy to heat thus partially loosening, vaporizing or ablating the absorber layer and the overlying silicone rubber.

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat.

U.S. Pat. No. 4,034,183 (Uhlig) describes the use of high-powered lasers to convert hydrophilic surface layers to hydrophobic surfaces. A similar process is described for converting polyamic acids into polyimides in U.S. Pat. No. 4,081,572 (Pacansky). The use of high-powered lasers is undesirable in the industry because of their high electrical power requirements and because of their need for cooling and frequent maintenance.

U.S. Pat. No. 4,634,659 (Esumi et al.) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al.) and U.S. Pat. No. 4,548,893 (Lee et al.) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al.). U.S. Pat. No. 5,512,418 (Ma) describes the use of polymers having cationic quaternary ammonium groups that are heat-sensitive. However, the materials described in this art require wet processing after imaging.

WO 92/09934 (Vogel et al.) describes photosensitive compositions containing a photoacid generator and a polymer with acid labile tetrahydropyranyl or activated ester groups. However, imaging of these compositions converts the imaged areas from hydrophobic to hydrophilic in nature.

In addition, EP-A 0 652 483 (Ellis et al.) describes lithographic printing plates imageable using infrared radiation ("IR") lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired.

U.S. Pat. No. 5,985,514 (Zheng et al.) is directed to processless direct write printing plates that include an imaging layer containing heat sensitive polymers. The polymer coatings are sensitized to infrared radiation by the incorporation of an infrared absorbing material such as an organic dye or a fine dispersion of carbon black. Upon exposure to a high intensity infrared laser, light absorbed by the organic dye or carbon black is converted to heat, thereby promoting a physical and/or chemical change in the polymer (usually a change in hydrophilicity or hydrophobicity). The resulting printing plates can be used on conventional printing presses to provide, for example, negative images. Such printing plates have utility in the evolving "computer-to-plate" or "direct-write" printing market.

Other imaging members having "switchable" imaging layers are described in U.S. Pat. No. 6,146,812 (Leon et al.) wherein switching occurs rapidly yet the heat-sensitive polymers have improved shelf life stability.

Some of the heat-sensitive polymers described in the copending applications, particularly the polymers containing organoonium or other charged groups, have a tendency to undergo physical interactions or chemical reactions with the organic dye or carbon black, thus compromising the effectiveness of both polymers and heat-absorbing materials.

Organic dye salts, by nature, are often partially soluble in water or alcoholic coating solvents and are thus preferred as IR dye sensitizers. However, many such salts have been found to be unacceptable because of insufficient solubility, because they react with the charged polymer to form hydrophobic products that can result in scummed or toned images, or because they offer insufficient thermal sensitization in imaging members. In particular, there is a need to have IR dye sensitizers that are compatible with thiosulfate polymers, such as those described in U.S. Pat. No. 5,985,514 (noted above).

Other imaging members comprise cationic heat-sensitive ionomers that are used in combination with IR-sensitive dyes or carbon. Representative cationic ionomers are described for example in U.S. Pat. No. 6,190,830 (Leon et al.) and U.S. Pat. No. 6,190,831 (Leon et al.).

Improved thermally sensitive compositions and imaging members are also described in GB 2,358,710 (DoMinh et al.). These compositions comprise IR sensitive oxonol dyes that are described in U.S. Pat. No. 6,248,886 (Williams et al.) and U.S. Pat. No. 6,248,893 (Williams et al.).

There is a need for direct-write lithographic imaging members that contain IR sensitive compounds that have improved compatibility with various charged thermally sensitive polymers.

SUMMARY OF THE INVENTION

The problems noted above are overcome with a heat-sensitive composition comprising:

a) a hydrophilic heat-sensitive ionomer, b) water or a water-miscible organic solvent, and c) an infrared radiation sensitive negatively-charged oxonol dye that has a $\lambda_{max}$ greater than 700 nm as measured in water or a water-miscible organic solvent, the negatively-charged oxonol dye being represented by the following Structure I:

I

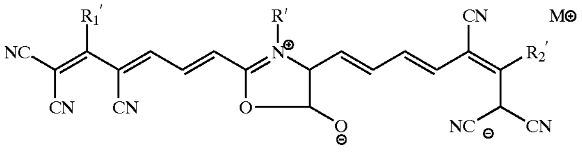

wherein R' is a substituted or unsubstituted alkyl group, substituted or unsubstituted cycloalkyl group, substituted or unsubstituted heterocyclic group, or substituted or unsubstituted carbocyclic aromatic group, $R_1$' and $R_2$' are independently substituted or unsubstituted heterocyclic or carbocyclic aromatic groups, and $M^+$ is a monovalent cation.

This invention also provides a negative-working imaging member comprising a support and having disposed thereon a hydrophilic imaging layer that is prepared from the heat-sensitive composition described above.

Still further, this invention includes a method of imaging comprising the steps of:

A) providing the negative-working imaging member described above, and

B) imagewise exposing the imaging member to provide exposed and unexposed areas in the imaging layer of the imaging member, whereby the exposed areas are rendered more hydrophobic than the unexposed areas by heat provided by the imagewise exposure.

Still again, a method of printing comprises the steps of carrying out steps A and B noted above, and additionally:

C) contacting the imagewise exposed imaging member with a lithographic printing ink, and imagewise transferring that printing ink from the imaging member to a receiving material.

As used herein, the term "ionomer" refers to a positively or negatively charged polymer having at least 15 mol % of the recurring units negatively charged.

The imaging members of this invention have a number of advantages, and provide solutions to the problems recognized in previous printing plates. Specifically, the problems and concerns associated with ablation imaging (that is, imagewise removal of a surface layer) are avoided because the hydrophilicity of the imaging layer is changed imagewise by "switching" (preferably, irreversibly) exposed areas of its printing surface to be less hydrophilic (that is, become more hydrophobic when heated). Thus, the imaging layer stays intact during and after imaging (that is, no ablation occurs). These advantages are achieved by using a hydrophilic heat-sensitive polymer (ionomer) having recurring charged groups within the polymer backbone or chemically attached thereto. Such polymers and groups are described in more detail below. The polymers used in the imaging layer are readily prepared using procedures described herein, and the imaging members of this invention are simple to make and use without the need for post-imaging wet processing. The resulting printing members formed from the imaging members of this invention are negative working in nature. Moreover, conventional alkaline development is not necessary with the imaging members of this invention.

Charged polymers that are used in the practice of this invention are typically coated out of water and methanol, and other water-miscible solvents that will readily dissolve these water-soluble polymeric salts.

The "complex" oxonol infrared radiation-sensitive dyes ("IR dyes" herein) used in this invention are negatively charged IR sensitizers for thermal imaging members because they can be selected to have maximum absorption at the operating wavelength of a laser platesetter (generally 700 nm or more). Moreover, they can be coated in a dissolved (that is molecularly dispersed) state, providing for maximized utilization of energy as well as maximized image resolution capability. The heat-sensitive compositions of this invention provide increased photospeed at reduced IR dye coverage and release minimal gaseous effluents. Furthermore, we have not observed adverse effects from an interaction of ionomers polymers (particularly thiosulfate polymers) and the negatively charged oxonol IR dyes useful in the present invention.

DETAILED DESCRIPTION OF THE INVENTION

The imaging members of this invention comprise a support and one or more layers disposed thereon that include a dried heat-sensitive composition. The support can be any self-supporting material including polymeric films, glass, ceramics, cellulosic materials (including papers), metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 $\mu$m. Another preferred embodiment uses aluminum sheets having a thickness of from about 100 to about 600 μm. The support should resist dimensional change under conditions of use.

The support may also be a cylindrical support that includes printing cylinders on press as well as printing sleeves that are fitted over printing cylinders. The use of such supports to provide cylindrical imaging members is described in U.S. Pat. No. 5,713,287 (Gelbart). The heat-sensitive polymer composition can be coated or sprayed directly onto the cylindrical surface that is an integral part of the printing press.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imaging member.

The imaging members, however, preferably have only one layer on the support, that is a heat-sensitive surface layer that is required for imaging. This hydrophilic layer is prepared from a heat-sensitive composition of this invention and includes one or more heat-sensitive ionomers and one or more negatively charged oxonol IR dyes as a photothermal conversion material (both described below). Because of the particular polymer(s) used in the imaging layer, the exposed (imaged) areas of the layer are rendered more hydrophobic in nature. The unexposed areas remain hydrophilic in nature.

Thus, in the heat-sensitive imaging layer of the imaging member, only the one or more ionomers and one or more negatively charged oxonol IR dyes are essential for imaging. The charged ionomers generally are comprised of recurring units, of which at least 15 mol % include anionic groups. Preferably, at least 20 mol % of the recurring groups include anionic groups. Thus each of these ionomers has a net positive or negative charge provided by these anionic groups.

Representative charged ionomers useful in the practice of this invention can be in described in any of three broad classes of materials:

I) crosslinked or uncrosslinked vinyl polymers comprising recurring units comprising positively charged, pendant N-alkylated aromatic heterocyclic groups, II) crosslinked or uncrosslinked polymers comprising recurring organoonium groups, and III) polymers comprising a pendant thiosulfate (Bunte salt) group.

Each class of polymers is described in turn. The imaging layer can include mixtures of polymers from each class, or a mixture of one or more polymers of two or more classes. In addition, the imaging layer can include one or more ionomers that do not belong in any of these classes of polymers. The Class III polymers are preferred.

Class I Polymers

The Class I polymers generally have a molecular weight of at least 1000 and can be any of a wide variety of hydrophilic vinyl homopolymers and copolymers having the requisite positively charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively charged group, and another monomer that is capable of providing other properties, such as crosslinking sites and possibly adhesion to the support. Procedures and reactants needed to prepare these polymers are well known. With the additional teaching provided herein, the known polymer reactants and conditions can be modified by a skilled artisan to attach a suitable cationic group.

The presence of a cationic group apparently provides or facilitates the "switching" of the imaging layer from hydrophilic to hydrophobic in the areas that have been exposed to heat in some manner, when the cationic group reacts with its counterion. The net result is the loss of charge. Such reactions are more easily accomplished when the anion is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate, and others readily apparent to one skilled in the art. The halides and carboxylates are preferred.

The aromatic cationic group is present in sufficient recurring units of the polymer so that the heat-activated reaction described above can provide desired hydrophobicity of the imaged printing layer. The groups can be attached along a principal backbone of the polymer, or to one or more branches of a polymeric network, or both. The aromatic groups generally comprise 5 to 10 carbon, nitrogen, sulfur or oxygen atoms in the ring (at least one being a positively charged nitrogen atom), to which is attached a branched or unbranched, substituted or unsubstituted alkyl group. Thus, the recurring units containing the aromatic heterocyclic group can be represented by the Structure II:

II

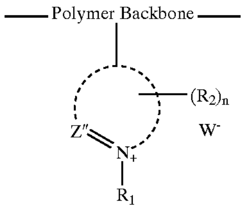

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl, and dodecyl). Preferably, $R_1$ is a substituted or unsubstituted, branched or unbranched alkyl group having from 1 to 6 carbon atoms, and most preferably, it is substituted or unsubstituted methyl group.

$R_2$ can be a substituted or unsubstituted alkyl group (as defined above, and additionally a cyanoalkyl group, a hydroxyalkyl group or alkoxyalkyl group), substituted or unsubstituted alkoxy having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), halo (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is substituted or unsubstituted methyl or ethyl group.

Z" represents the carbon and any additional nitrogen, oxygen, or sulfur atoms necessary to complete the 5- to 10-membered aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most preferably it is acetate or chloride.

Also in Structure II, n is defined as 0 to 6, and is preferably 0 or 1. Most preferably, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The recurring units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

Preferred Class I polymers can be represented by the following Structure III that represents random recurring units derived from one or more monomers as described below:

III

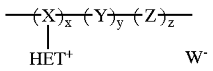

wherein X represents recurring units to which the N-alkylated nitrogen containing aromatic heterocyclic groups (represented by $HET^+$) are attached, Y represents recurring units derived from ethylenically unsaturated polymerizable monomers that may provide active sites for crosslinking using any of various crosslinking mechanisms (described below), $W^-$ is a suitable anion as described above, and Z represents recurring units derived from any additional ethylenically unsaturated polymerizable monomers. The various repeating units are present in suitable amounts, as represented by x being from about 20 to 100 mol %, y being from about 0 to about 20 mol %, and z being from 0 to 80 mol %. Preferably, x is from about 30 to about 98 mol %, y is from about 2 to about 10 mol % and z is from 0 to about 68 mol %.

Crosslinking of the polymers can be provided in a number of ways. There are numerous monomers and methods for crosslinking that are familiar to one skilled in the art. Some representative crosslinking strategies include, but are not necessarily limited to:

a) reacting an amine or carboxylic acid or other Lewis basic units with di-epoxide crosslinkers, b) reacting an epoxide units within the polymer with di-functional amines, carboxylic acids, or other di-functional Lewis basic unit, c) irradiative or radical-initiated crosslinking of double bond-containing units such as acrylates, methacrylates, cinnamates, or vinyl groups, d) reacting a multivalent metal salts with ligating groups within the polymer (the reaction of zinc salts with carboxylic acid-containing polymers is an example), e) using crosslinkable monomers that react via the Knoevenagel condensation reaction, such as (2-acetoacetoxy)ethyl acrylate and methacrylate, f) reacting an amine, thiol, or carboxylic acid groups with a divinyl compound (such as bis (vinylsulfonyl) methane) via a Michael addition reaction, g) reacting a carboxylic acid units with crosslinkers having multiple aziridine units, h) reacting a crosslinkers having multiple isocyanate units with amines, thiols, or alcohols within the polymer, i) mechanisms involving the formation of interchain sol-gel linkages [such as the use of the 3-(trimethoxysilyl) propylmethacrylate monomer], j) oxidative crosslinking using an added radical initiator (such as a peroxide or hydroperoxide), k) autooxidative crosslinking, such as employed by alkyd resins, l) sulfur vulcanization, and m) processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Additional monomers that provide the repeating units represented by "Z" in the Structure III above include any useful hydrophilic or oleophilic ethylenically unsaturated polymerizable monomer that may provide desired physical or printing properties to the hydrophilic imaging layer. Such monomers include, but are not limited to, acrylates, methacrylates, isoprene, acrylonitrile, styrene and styrene derivatives, acrylamides, methacrylamides, acrylic or methacrylic acid and vinyl halides.

Representative Class I polymers are identified below as Polymers 1 and 3–6. Mixtures of these polymers can also be used. Polymer 2 below is a precursor to a useful Class I polymer. Further details of these polymers and methods of their preparation are provided in U.S. Pat. No. 6,190,831 (Leon et al.).

Polymer 1: Poly(1-vinyl-3-methylimidazolium chloride-co-N-(3-aminopropyl) methacrylamide hydrochloride), Polymer 2: Poly(methyl methacrylate-co4-vinylpyridine), Polymer 3: Poly(methyl methacrylate-co-N-methyl-4-vinylpyridinium formate), Polymer 4: Poly(methyl methacrylate-co-N-butyl-4-vinylpyridinium formate), Polymer 5: Poly(methyl methacrylate-co-2-vinylpyridine), and Polymer 6: Poly(methyl methacrylate-co-N-methyl-2-vinylpyridinium formate).

Class II Polymers

The Class II polymers also generally have a molecular weight of at least 1000. They can be any of a wide variety of vinyl or non-vinyl homopolymers and copolymers.

Non-vinyl polymers of Class II include, but are not limited to, polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide)ionomers, polysulfides and polybenzimidazoles. Preferably, such non-vinyl polymers are silicon based sol gels, polyarylene oxides, poly (phenylene sulfide)ionomers or polyxylylenes, and most preferably, they are poly(phenylene sulfide)ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes. These colloids are formed by methods described in U.S. Pat. No. 2,244,325 (Bird), U.S. Pat. No. 2,574,902 (Bechtold et al.), and U.S. Pat. No. 2,597,872 (Iler). Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the polymer in some fashion apparently provides or facilitates the "switching" of the imaging layer from hydrophilic to oleophilic in the exposed areas upon exposure to energy that provides or generates heat, when the cationic moiety reacts with its counterion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The tetrasubstituted nitrogen (organoammonium) moieties are preferred. This moiety can be chemically attached to (that is, pendant) the polymer backbone, or incorporated within the backbone in some fashion, along with the suitable counterion. In either embodiment, the organoonium moiety is present in sufficient repeating units of the polymer (at least 15 mol %) so that the heat-activated reaction described above can occur to provide desired hydrophobicity of the imaging layer. When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. Preferably, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a "leaving group" functionality (such as a halogen) by a tertiary amine nucleophile. Alternatively, the organoonium group can be present on a monomer that is then polymerized or derived by the alkylation of a neutral heteroatom unit (trivalent nitrogen or phosphorous group or divalent sulfur group) already incorporated within the polymer.

The organoonium moiety is substituted to provide a positive charge. Each substituent must have at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable anion as described above for the Class I polymers. The halides and carboxylates are preferred.

In addition, vinyl Class II polymers can be used in the practice of this invention. Like the non-vinyl polymers, such heat-sensitive polymers are composed of recurring units having one or more types of organoonium group. For example, such a polymer can have recurring units with both organoammonium groups and organosulfonium groups. It is also not necessary that all of the organoonium groups have the same alkyl substituents. For example, a polymer can have recurring units having more than one type of organoammonium group. Useful anions in these polymers are the same as those described above for the non-vinyl polymers. In addition, the halides and carboxylates are preferred.

The organoonium group is present in sufficient recurring units of the polymer so that the heat-activated reaction described above can occur to provide desired hydrophobicity of the imaged printing layer. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the vinyl polymer provides the desired positive charge. Generally, preferred pendant organoonium groups can be illustrated by the following Structures IV, V, and VI:

IV

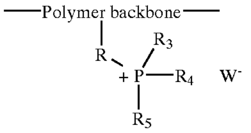

V

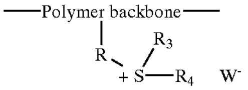

VI

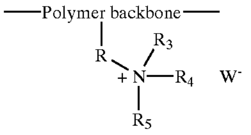

wherein R is a substituted or unsubstituted alkylene group having 1 to 12 carbon atoms that can also include one or more oxy, thio, carbonyl, amido, or alkoxycarbonyl groups with the chain (such as methylene, ethylene, isopropylene, methylenephenylene, methyleneoxymethylene, n-butylene, and hexylene), a substituted or unsubstituted arylene group having 6 to 10 carbon atoms in the ring (such as phenylene, naphthylene, xylylene, and 3-methoxyphenylene), or a substituted or unsubstituted cycloalkylene group having 5 to 10 carbon atoms in the ring (such as 1,4-cyclohexylene and 3-methyl-1,4-cyclohexylene). In addition, R can be a combination of two or more of the defined substituted or unsubstituted alkylene, arylene, and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_3$, $R_4$ and $R^5$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy, and cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl, and cyanophenyl), or a substituted or unsubstituted cycloalkyl group having 5 to 10 carbon atoms in the carbocyclic ring (such as 1,3- or 1,4-cyclohexyl). Alternatively, any two of $R_3$, $R_4$, and $R_5$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium, and pyrrolidinium groups for Structure VI. Other useful substituents for these various groups would be readily apparent to one skilled in the art, and any combinations of the expressly described substituents are also contemplated.

Preferably, $R_3$, $R_4$, and $R_5$ are independently substituted or unsubstituted methyl or ethyl groups.

$W^-$ is any suitable anion as described above for the Class I polymers. Acetate and chloride are preferred anions.

Polymers containing quaternary ammonium groups as described herein are most preferred vinyl Class II polymers.

The vinyl Class II polymers useful in the practice of this invention can be represented by the following Structure VII that represents random recurring units derived from one or more monomers as described below in Structure VII:

VII

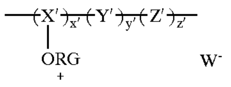

wherein X' represents recurring units to which the organoonium groups ("ORG") are attached, Y' represents recurring units derived from ethylenically unsaturated polymerizable monomers that may provide active sites for crosslinking using any of various crosslinking mechanisms (described below), and Z' represents recurring units derived from any additional ethylenically unsaturated polymerizable monomers. The various recurring units are present in suitable amounts, as represented by x' being from about 15 to about 99 mol %, y' being from about 1 to about 20 mol %, and z' being from 0 to about 84 mol %. Preferably, x' is from about 20 to about 98 mol %, y' is from about 2 to about 10 mol %, and z' is from 0 to about 78 mol %. $W^-$ is a suitable cation as described above.

Crosslinking of the vinyl polymer can be achieved in the same way as described above for the Class I polymers.

Additional monomers that provide the additional recurring units represented by Z' in Structure VII include any useful hydrophilic or oleophilic ethylenically unsaturated polymerizable monomer that may provide desired physical or printing properties to the imaging layer. Such monomers include, but are not limited to, acrylates, methacrylates, acrylonitrile, isoprene, styrene and styrene derivatives, acrylamides, methacrylamides, acrylic or methacrylic acid, and vinyl halides.

Representative Class II non-vinyl polymers are identified herein below as Polymers 7–8 and 10–18. Mixtures of these polymers can also be used. Polymer 9 is a precursor to Polymer 10. Further details of such polymers and methods of preparing them are provided in U.S. Pat. No. 6,109,830 (Leon et al).

Polymer 7: Poly(p-xylidenetetrahydro-thiophenium chloride),

Polymer 8: Poly[phenylene sulfide-co-methyl(4-thiophenyl) sulfonium chloride],

Polymer 9: Brominated poly(2,6-dimethyl-1,4-phenylene oxide),

Polymer 10: Dimethyl sulfonium bromide derivative of poly(2,6-dimethyl-1,4-phenylene oxide), Polymer 11: Poly[methyl methacrylate-co-2-trimethylammoniumethyl methacrylic chloride-co-N-(3-aminopropyl)methacrylamide hydrochloride], Polymer 12: Poly[methyl methacrylate-co-2-trimethylammoniumethyl methacrylic acetate-co-N-(3-aminopropyl)methacrylamide], Polymer 13: Poly[methyl methacrylate-co-2-trimethylammoniumethyl methacrylic fluoride-co-N-(3-aminopropyl)methacrylamide hydrochloride], Polymer 14: Poly[vinylbenzyl trimethylammonium chloride-co-N-(3-aminopropyl)methacrylamide hydrochloride], Polymer 15: Poly([vinylbenzyltrimethyl-phosphonium acetate-co-N-(3-aminopropyl)methacrylamide hydrochloride], Polymer 16: Poly[dimethyl-2-(methacryloyloxy) ethylsulfonium chloride-co-N-(3-aminopropyl) methacrylamide hydrochloride], Polymer 17: Poly[vinylbenzyldimethylsulfonium methylsulfate], and Polymer 18: Poly[vinylbenzyldimethylsulfonium chloride].

Class III Polymers

Each of the Class III polymers has a molecular weight of at least 1000, and preferably of at least 5000. For example, the polymers can be vinyl homopolymers or copolymers prepared from one or more ethylenically unsaturated polymerizable monomers that are reacted together using known polymerization techniques and reactants. Alternatively, they can be addition homopolymers or copolymers (such as polyethers) prepared from one or more heterocyclic monomers that are reacted together using known polymerization techniques and reactants. Additionally, they can be condensation type polymers (such as polyesters, polyimides, polyamides or polyurethanes) prepared using known polymerization techniques and reactants. Whatever the type of polymers, at least 15 mol % (preferably 20 mol %) of the total recurring units in the polymer comprise the necessary heat-activatable thiosulfate groups.

The Class III polymers useful in the practice of this invention can be represented by the following Structure VIII wherein the thiosulfate group (or Bunte salt) is a pendant group:

VIII

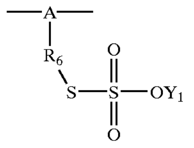

wherein A represents a polymeric backbone, $R_6$ is a divalent linking group, and $Y_1$ is hydrogen or a cation.

Useful polymeric backbones include, but are not limited to, vinyl polymers, polyethers, polyimides, polyamides, polyurethanes and polyesters. Preferably, the polymeric backbone is a vinyl polymer or polyether.

Useful $R_6$ linking groups include $-(COO)_{n1}(Z_1)_m-$ wherein n1 is 0 or 1, m is 0 or 1, and $Z_1$ is a substituted or unsubstituted alkylene group having 1 to 6 carbon atoms (such as methylene, ethylene, n-propylene, isopropylene, butylenes, 2-hydroxypropylene, and 2-hydroxy4-azahexylene) that can have one or more oxygen, nitrogen or sulfur atoms in the chain, a substituted or unsubstituted arylene group having 6 to 14 carbon atoms in the aromatic ring (such as phenylene, naphthalene, anthracylene and xylylene), or a substituted or unsubstituted arylenealkylene (or alkylenearylene) group having 7 to 20 carbon atoms in the chain (such as p-methylenephenylene, phenylenemethylene-phenylene, biphenylene, and phenyleneisopropylenephenylene). In addition, $R_6$ can be an alkylene group, an arylene group, in an arylenealkylene group as defined above for $Z_1$.

Preferably, $R_6$ is a substituted or unsubstituted of alkylene group of 1 to 3 carbon atoms, a substituted or unsubstituted arylene group of 6 carbon atoms in the aromatic ring, an arylenealkylene group of 7 or 8 carbon atoms in the chain, or $-COO(Z_1)_m-$ wherein $Z_1$ is methylene, ethylene or phenylene. Most preferably, $R_6$ is phenylene, methylene or —COO—.

$Y_1$ is hydrogen, ammonium ion, or a metal ion (such as sodium, potassium, magnesium, calcium, cesium, barium, zinc, or lithium ion). Preferably, $Y_1$ is hydrogen, ammonium, sodium, or potassium ion.

As the thiosulfate group is generally pendant to the backbone, preferably it is part of an ethylenically unsaturated polymerizable monomer that can be polymerized using conventional techniques to form vinyl homopolymers of the thiosulfate-containing recurring units, or vinyl copolymers when copolymerized with one or more additional ethylenically unsaturated polymerizable monomers. The thiosulfate-containing recurring units generally comprise at least 15 mol % of all recurring units in the polymer, preferably they comprise from about 20 to 100 mol % of all recurring units. A polymer can include more than one type of repeating unit containing a thiosulfate group as described herein.

Polymers having the above-described thiosulfate group are believed to crosslink and to switch from hydrophilic thiosulfate to hydrophobic disulfide (upon loss of sulfate) with heating.

Thiosulfate-containing molecules (or Bunte salts) can be prepared from the reaction between an alkyl halide and thiosulfate salt as taught by Bunte, *Chem.Ber.* 7, 646, 1884. Polymers containing thiosulfate groups can either be prepared from functional monomers or from preformed polymers. Polymers can also be prepared from preformed polymers in a similar manner as described in U.S. Pat. No. 3,706,706 (Vandenberg). Thiosulfate-containing molecules can also be prepared by reaction of an alkyl epoxide with a thiosulfate salt, or between an alkyl epoxide and a molecule containing a thiosulfate moiety (such as 2-aminoethanethiosulfuric acid), and the reaction can be performed either on a monomer or polymer as illustrated by Thames, *Surf. Coating,* 3 (Waterborne Coat.), Chapter 3, pp. 125–153, Wilson et al (Eds.).

Details for making Class III polymers are provided in U.S. Pat. No. 5,985,514 (noted above), incorporated herein by reference.

Vinyl polymers can be prepared by copolymerizing monomers containing the thiosulfate functional groups with one or more other ethylenically unsaturated polymerizable monomers to modify polymer chemical or functional properties, to optimize imaging member performance, or to introduce additional crosslinking capability.

Useful additional ethylenically unsaturated polymerizable monomers include, but are not limited to, acrylates (including methacrylates) such as ethyl acrylate, n-butyl acrylate, methyl methacrylate and t-butyl methacrylate, acrylamides (including methacrylamides), an acrylonitrile (including methacrylonitrile), vinyl ethers, styrenes, vinyl acetate, dienes (such as ethylene, propylene, 1,3-butadiene, and isobutylene), vinyl pyridine and vinylpyrrolidone. Acrylamides, acrylates, and styrenes are preferred.

Useful polymers of Class III include, for example:

Polymer 19: Poly(chloromethyl-ethylene oxide-co-sodium thiosulfate methyl-ethylene oxide), Polymer 20: Poly(vinyl benzyl thiosulfate sodium salt-co-methyl methacrylate), Polymer 21: Poly[vinyl benzyl thiosulfate sodium salt-co-N-(3-aminopropyl)methacylamide hydrochloride], Polymer 22: Poly(vinyl benzyl thiosulfate sodium salt), Polymer 23: Poly(2-sodium thiosulfate-co-ethyl methacrylate), Polymer 24: Poly[2-hydroxy-3-sodium thiosulfate-propyl methacrylate-co-2-(methacryloyloxy)ethyl acetoacetate), and Polymer 25: Poly(4-aza-2-hydroxy-6-sodium thiosulfate-hexyl methacrylate).

The imaging layer of the imaging member can include one or more ionomers with or without minor amounts (less than 20 weight %, based on total dry weight of the layer) of additional binder or polymeric materials that will not adversely affect its imaging properties.

In the composition used to provide the heat-sensitive layer, the amount of ionomer is generally present in an amount of at least 1 weight %, and preferably at least 2 weight %. A practical upper limit of the amount of ionomer in the composition is about 10 weight %.

The amount of ionomer used in the imaging layer is generally at least 0.1 g/m$^2$, and preferably from about 0.1 to about 10 g/m$^2$ (dry weight). This generally provides an average dry layer thickness of from about 0.1 to about 10 $\mu$m.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

It is essential that the heat-sensitive imaging layer includes one or more photothermal conversion materials to absorb appropriate radiation from an appropriate energy source (such as a laser), which radiation is converted into heat. Thus, such materials convert photons into heat. Preferably, the radiation absorbed is in the infrared and near-infrared regions of the electromagnetic spectrum. At least one of the photothermal conversion materials used in this invention is a negatively-charged oxonol IR dye that comprise a methine linkage conjugated to a negatively-charged group.

It is also preferred that the negatively-charged oxonol IR dye be soluble in water or any of the water-miscible organic solvents that are described below as useful for preparing heat-sensitive compositions. More preferably, these IR dyes are soluble in either water or methanol, or a mixture of water and methanol. Solubility in water or the water-miscible organic solvents means that the negatively-charged oxonol IR dye can be dissolved at a concentration of at least 0.5 g/l at room temperature at room temperature.

The negatively-charged oxonol IR dyes are sensitive to radiation in the near-infrared and infrared regions of the electromagnetic spectrum. Thus, they generally have a $\lambda_{max}$ at or above 700 nm (preferably a $\lambda_{max}$ of from about 750 to about 900 nm, and more preferably a $\lambda_{max}$ of from about 800 to about 850 nm).

The negatively-charged oxonol IR dyes useful in this invention are generally anionic dyes having a polymethine chain conjugated with 2 cyclic or aliphatic groups, one of which is negatively charged.

Useful negatively-charged oxonol IR dyes can be synthesized using general procedures described by Hamer in *The Cyanine Dyes and Related Compounds,* Interscience Publishers, 1964. A preferred synthetic method is described below. The dyes may be provided for incorporation into the heat-sensitive formulations of this invention in any suitable manner. In a preferred embodiment, the dyes are dissolved in a suitable organic solvent.

Useful negatively-charged oxonol IR dyes useful in the practice of this invention can be represented by the following Structure I:

I

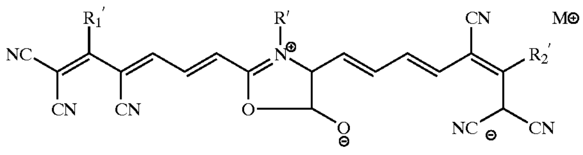

wherein R' is a substituted or unsubstituted alkyl group having 1 to 20 carbon atoms (methyl, ethyl, isopropyl, t-butyl, hexyl, dodecyl, aminoethyl, methylsulfonaminoethyl, and other groups readily apparent to one skilled in the art), substituted or unsubstituted carbocyclic aromatic groups (such as phenyl, naphthyl, xylyl, m-carboxyphenyl, and others than would be readily apparent to one skilled in the art), substituted or unsubstituted heterocyclic groups (aromatic or non-aromatic) having 3 to 8 carbon, oxygen, nitrogen and sulfur atoms in the ring structure (such as morpholino, pyridyl, pyrimidyl, thiomorpholino, pyrrolidinyl, piperazinyl, and others that would be readily apparent to one skilled in the art), or a substituted or unsubstituted cycloalkyl group having 4 to 12 carbon atoms in the ring system including fused ring systems (such as cyclopenyl, cyclohexyl, and others that would be readily apparent to one skilled in the art).

Preferably, R' is a substituted or unsubstituted alkyl group having 1 to 10 carbon atoms or a substituted or unsubstituted phenyl group. More preferably, R' is a substituted or unsubstituted alkyl group having 1 to 4 carbon atoms (such as substituted or unsubstituted methyl, ethyl, n-propyl, isopropyl, and t-butyl groups) or a substituted or unsubstituted phenyl group. Most preferably, R' is an unsubstituted methyl, ethyl, isopropyl, or phenyl group.

$R_1$' and $R_2$' are independently substituted or unsubstituted heterocyclic or carbocyclic aromatic groups having from 5 to 12 atoms in the aromatic ring (including fused ring systems). Preferably, $R_1$' and $R_2$' represent the same aromatic group. Useful aromatic groups include, but are not limited to, substituted or unsubstituted phenyl groups, substituted or unsubstituted naphthyl groups, substituted or unsubstituted furyl groups, substituted and unsubstituted thiophenyl groups, and substituted or unsubstituted benzofuryl groups. These aromatic groups can be substituted with one or more amino, methoxy, carboxy, sulfo, sulfonamido, or alkylsulfonyl groups. Preferably, when $R_1$' and $R_2$' are substituted, they each have one or more of the same substituents.

$M^+$ is a suitable monovalent cation such as an alkali metal ion (lithium, sodium or potassium), an ammonium ion, a trialkylammonium ion (such as trimethylammonium, triethyleammonium or tributylammonium ions), a tetraalkylammonium ion (such as tetramethylammonium ion), pyridinium ion, or tetramethyl guanidinium ion.

A preferred class of compounds of this invention are those represented by the Structure I shown above wherein R' is a substituted or unsubstituted alkyl group having 1 to 4 carbon atoms or substituted or unsubstituted carbocyclic aryl group (such as a phenyl group), and $R_1$' and $R_2$' are independently substituted or unsubstituted carbocyclic aromatic groups (that is aryl groups such as phenyl groups).

The dyes of this invention can exist in several tautomeric forms, for example as shown below:

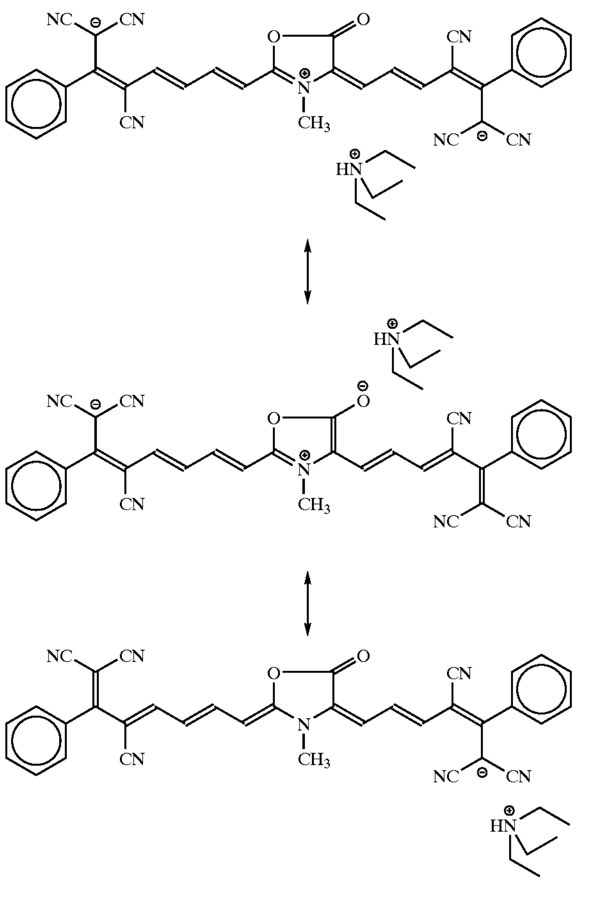

Examples of oxonol IR dyes of this invention include, but are not limited to, the following compounds:

The one or more negatively-charged oxonol IR dyes are present in the heat-sensitive or thermal imaging composition of this invention in an amount of generally at least 0.2 weight % (% solids), and preferably at least 0.4 weight %. The upper limit of IR dye is not critical but is governed by the IR dye cost, desired thermal sensitivity and solvent solubility. A practical limit may be about 1 weight %. The amount of IR dye is provided in the heat-imaging layer of an imaging member sufficient to provide a transmission optical density of at least 0.1, and preferably of at least 0.3 when exposed to radiation having a $\lambda_{max}$ of 830 nm.

The heat-sensitive compositions and imaging layers can include additional photothermal conversion materials, although the presence of such materials is not preferred. Such optional materials can be other IR dyes, carbon black, polymer-grafted carbon, IR-absorbing pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Useful absorbing dyes for near infrared diode laser beams are described, for example, in U.S. Pat. No. 4,973,572 (DeBoer). Particular dyes of interest are "broad band" dyes, that is those that absorb over a wide band of the spectrum.

Alternatively, the same or different photothermal conversion material (including a negatively-charged oxonol IR dye described herein) can be provided in a separate layer that is in thermal contact with the heat-sensitive imaging layer. Thus, during imaging, the action of the additional photothermal conversion material can be transferred to the heat-sensitive imaging layer.

The heat-sensitive composition of this invention can be applied to a support using any suitable equipment and procedure, such as spin coating, knife coating, gravure coating, dip coating or extrusion hopper coating. In addition, IR Dye 1

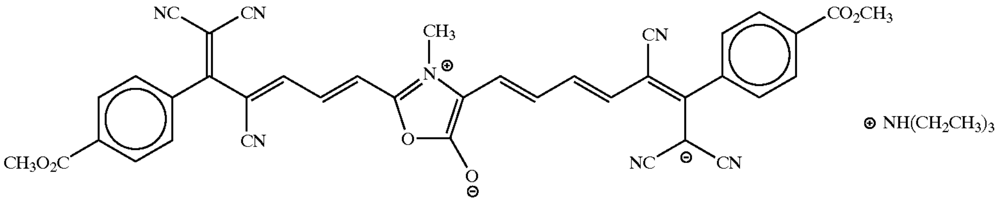

IR Dye 2

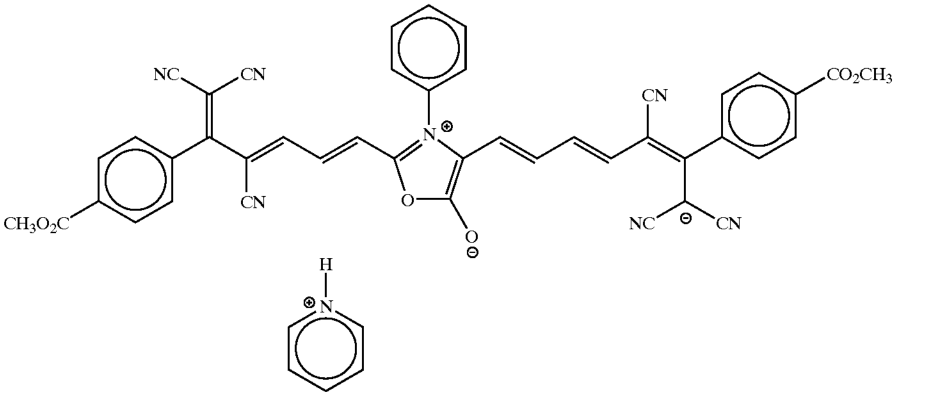

the composition can be sprayed onto a support, including a cylindrical support, using any suitable spraying means for example as described in U.S. Pat. No. 5,713,287 (noted above).

The heat-sensitive compositions of this invention are generally formulated in and coated from water or water-miscible organic solvents including, but not limited to, water-miscible alcohols (for example, methanol, ethanol, isopropanol, 1-methoxy-2-propanol, and n-propanol), methyl ethyl ketone, tetrahydrofuran, acetonitrile, N-N-dimethylformamide, butyrolactone, and acetone. Water, methanol, ethanol, and 1-methoxy-2-propanol are preferred. Mixtures (such as a mixture of water and methanol) of these solvents can also be used if desired. By "water-miscible" is meant that the solvent is soluble in water at all proportions at room temperature.

While the heat-sensitive compositions of this invention are preferably used in the lithographic printing plates described herein, they can be used for various other situations where a heat-sensitive composition may be useful to provide images.

The imaging members of this invention can be of any useful form including, but not limited to, printing plates, printing cylinders, printing sleeves, and printing tapes (including flexible printing webs), all of any suitable size or dimensions. Preferably, the imaging members are printing plates or on-press cylinders. Imaging members can also include elements that are not necessarily used in lithographic imaging and printing, but that are useful in other imaging systems.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. A laser used to expose the imaging members of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference with respect to such imaging devices. The imaging member is typically sensitized so as to maximize responsiveness at the emitting wavelength of the laser.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, incremented angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al). Such thermal printing heads are commercially available (for example, as Fujisu Thermal Head FTP-040 MCS001 and TDK Thermal Head F415 HH7-1089).

Imaging of heat-sensitive compositions on printing press cylinders can be accomplished using any suitable means, for example, as taught in U.S. Pat. No. 5,713,287 (noted above).

After imaging, the imaging member can be used for printing without conventional wet processing. Applied ink can be imagewise transferred to a suitable receiving material (such as cloth, paper, metal, glass, or plastic) to provide one or more desired impressions. If desired, an intermediate blanket roller can be used to transfer the ink from the imaging member to the receiving material. The imaging members can be cleaned between impressions, if desired, using conventional cleaning means.

The following examples illustrate the practice of the invention, and are not meant to limit it in any way. The synthetic methods are presented to show how some of the preferred heat-sensitive polymers and negatively charged oxonol IR dyes can be prepared.

Synthesis of IR Dyes

Oxonol IR Dye 1 was prepared using the following synthetic scheme that is generally useful for all of the compounds of this invention.

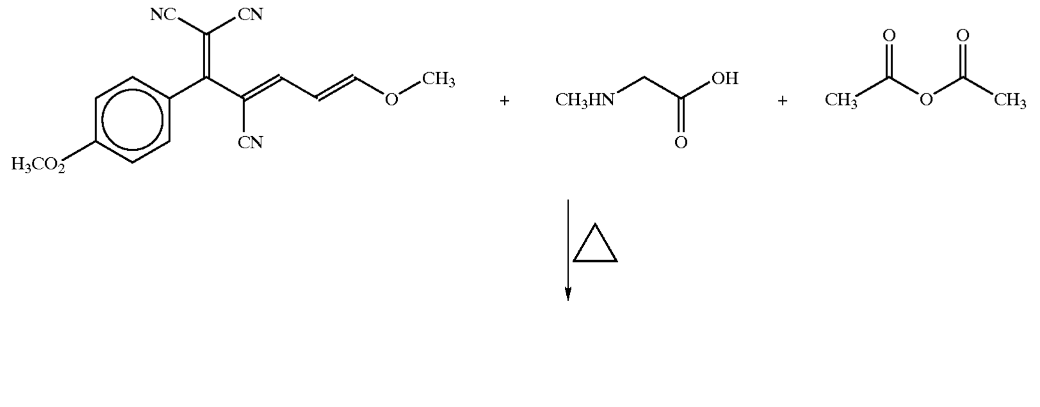

-continued

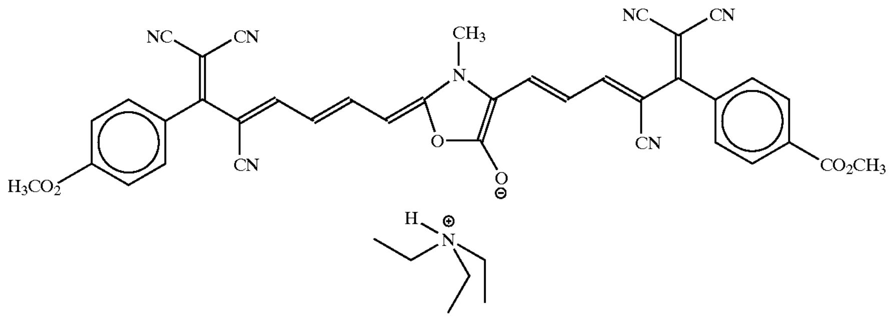

A sample of the noted cyano compound (6.4 g, 0.02 mole) was heated with 0.5 mole equivalents of sarcosine (commercially available from Aldrich Chemical Co.) in acetic anhydride to boiling. The reaction solution was heated for 5 minutes and triethylamine (5 ml) was added. The solution turned dark blue and after another 5 minutes a green solid precipitated. The solid was collected by filtration and washed 3 times with $CH_3CN$. The solid was dried 16 hours in a vacuum oven at 40° C. The structure was shown to be consistent with IR Dye__ by NMR and was determined to be >95% pure by HPLC ($\lambda_{max}$ 786 nm ($CH_3OH$), $\lambda_{max}$ 12.4× $10^4$).

IR Dye 2 was similarly prepared and identified except that pyridine was used in place of triethylamine and phenyl-$NHCH_2COOH$ was used in place of sarcosine.

The following examples illustrate the practice of this invention and its advantages over embodiments outside of the scope of the invention. The invention is not to be construed as limited to these examples.

INVENTION EXAMPLE 1 AND COMPARATIVE EXAMPLE 1

Imaging fonnulations 1 and 2 were prepared using the components (parts by weight) shown in TABLE I below.

TABLE I

| Component | Formulation 1 (Comparative Example 1) | Formulation 2 (Invention Example 1) |
|---|---|---|
| Polymer 22 | 0.30 | 0.33 |
| IR Dye A | 0.033 | — |
| Oxonol IR Dye 1 | — | 0.033 |
| Water | 4.14 | 3.24 |
| Methanol | 4.50 | 0.90 |
| Acetone | — | 4.50 |

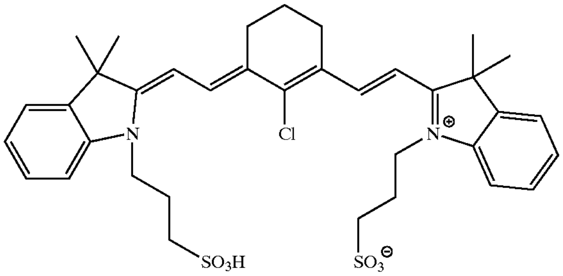

IR Dye A

Each formulation was coated at a dry coating weight of about 1.0 g/$m^2$ onto a grained phosphoric acid-anodized aluminum support. The resulting printing plates were air-dried. Each imaging layer of the printing plate was imaged at 830 nm on a plate setter like the commercially available CREO TRENDSETTER™ (but smaller in size) using doses ranging from 360 to 820 mJ/$cm^2$.

The imaging layer in Comparative Example 1 printing plate rapidly discolored to a tan color in the exposed regions producing an unmistakable sulfur odor during and after many hours following imaging. By contrast, the blue imaging layer in the Example 1 printing plate produced a deeper blue image and the undesirable sulfur smell was significantly reduced. Thus, the printing plates of this invention were found to exhibit reduced gaseous effluents upon imaging.

The imaged Example 1 plate was mounted on the plate cylinder of a commercially available full-page printing press (A. B. Dick 9870 duplicator) for press runs. A commercial black ink and Varn Universal Pink fountain solution (from Varn Products Co.) were used. The plate was developed on press within 60 seconds of the press run and printed with full density and high image quality for at least 1,000 impressions.

The invention has been described in detail with particular reference to preferred embodiments thereof, but it will be understood that variations and modifications can be effected within the spirit and scope of the invention.

We claim:

1. A heat-sensitive composition comprising:

a) a hydrophilic heat-sensitive charged ionomer, b) water or a water-miscible organic solvent, and c) an infrared radiation sensitive negatively-charged oxonol dye (IR dye) that has a $\lambda_{max}$ greater than 700 nm as measured in water or a water-miscible organic solvent, said IR dye being represented by the following Structure I:

I

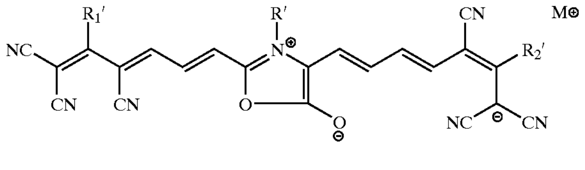

wherein R' is a substituted or unsubstituted alkyl group, substituted or unsubstituted cycloalkyl group, or substituted or unsubstituted heterocyclic group, or a substituted or unsubstituted carbocyclic aromatic group, $R'_1$ and $R'_2$ are independently substituted or unsubstituted heterocyclic or carbocyclic aromatic groups, and $M^+$ is a monovalent cation.

2. The heat-sensitive composition of claim 1 wherein said IR dye has a $\lambda_{max}$ of from about 750 to about 900 nm as measured in water or a water-miscible organic solvent.

3. The heat-sensitive composition of claim 1 wherein said IR dye has a $\lambda_{max}$ of from about 800 to about 850 nm as measured in water or a water-miscible organic solvent.

4. The compound of claim 1 wherein R' is a substituted or unsubstituted alkyl group or a substituted or unsubstituted phenyl group, and $R_1$' and $R_2$' are the same substituted or unsubstituted heterocyclic or carbocyclic aromatic group.

5. The compound of claim 1 wherein R' is a substituted or unsubstituted alkyl group having 1 to 4 carbon atoms, and $R_1$' and $R_2$' are the same or different substituted or unsubstituted carbocyclic aromatic group.

6. The compound of claim 5 wherein R' is a substituted or unsubstituted methyl, ethyl, isopropyl, or phenyl group.

7. The compound of claim 1 wherein R' is a substituted or unsubstituted alkyl group having 1 to 4 carbon atoms or a substituted or unsubstituted phenyl group, and $R_1$' and $R_2$' are the same substituted or unsubstituted phenyl group.

8. The heat-sensitive composition of claim 1 wherein said IR dye is one of following compounds:

IR Dye 1

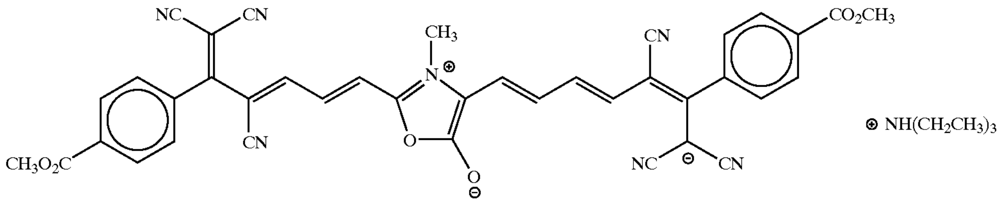

IR Dye 2

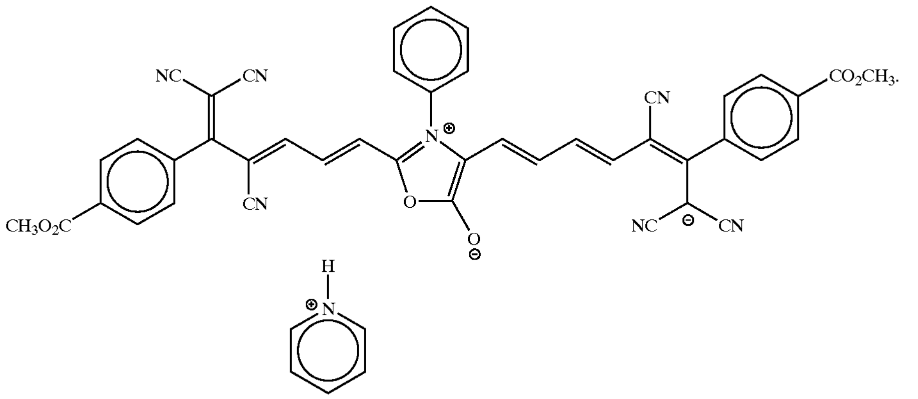

9. The heat-sensitive composition of claim 1 comprising water, methanol, ethanol, 1-methoxy-2-propanol, acetone, methyl ethyl ketone, acetonitrile, tetrahydrofuran, N-N-dimethylformamide, butyrolactone, or a mixture of two or more of these solvents.

10. The heat-sensitive composition of claim 1 wherein the heat-sensitive ionomer is selected from the following three classes of polymers:

I) a crosslinked or uncrosslinked vinyl polymer comprising recurring units comprising positively-charged, pendant N-alkylated aromatic heterocyclic groups, II) a crosslinked or uncrosslinked polymer comprising recurring organoonium groups, and III) a polymer comprising a pendant thiosulfate group.

11. The heat-sensitive composition of claim 10 wherein said heat-sensitive ionomer is a Class I polymer represented by the following Structure II:

II

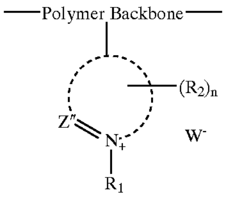

wherein $R_1$ is an alkyl group, $R_2$ is an alkyl group, an alkoxy group, an aryl group, an alkenyl group, halo, a cycloalkyl group, or a heterocyclic group having 5 to 8 atoms in the ring, Z" represents the carbon and nitrogen, oxygen, or sulfur atoms necessary to complete an aromatic N-heterocyclic ring having 5 to 10 atoms in the ring, n is 0 to 6, and $W^-$ is an anion.

12. The heat-sensitive composition of claim 10 wherein said heat-sensitive ionomer is a Class I polymer represented by the Structure III:

III

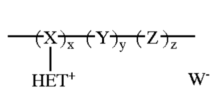

wherein $HET^+$ represents a positively-charged, pendant N-alkylated aromatic heterocyclic group, X represents recurring units having attached $HET^+$ groups, Y represents recurring units derived from ethylenically unsaturated polymerizable monomers that provide active crosslinking sites, Z represents recurring units for additional ethylenically unsaturated monomers, x is from about 20 to 100 mol %, y is from 0 to about 20 mol %, z is from 0 to about 80 mol %, and $W^-$ is an anion.

13. The heat-sensitive composition of claim 10 wherein said heat-sensitive ionomer is a Class II vinyl polymer represented by any of Structures IV, V, and VI:

IV

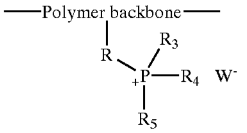

V

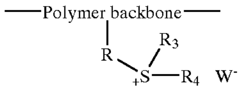

VI

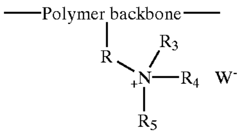

wherein R is an alkylene, arylene, or cycloalkylene group or a combination of two or more such groups, $R_3$, $R_4$ and $R_5$ are independently substituted or unsubstituted alkyl, aryl or cycloalkyl groups, or any two of $R_3$, $R_4$, and $R_5$ can be combined to form a heterocyclic ring with the charged phosphorus, nitrogen or sulfur atom, and $W^-$ is an anion.

14. The heat-sensitive composition of claim 10 wherein said Class II polymer is represented by the following Structure VII:

VII

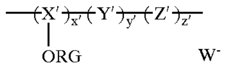

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, $W^-$ is an anion, x' is from about 20 to about 99 mol %, y' is from about 1 to about 20 mol %, and z' is from 0 to about 79 mol %.

15. The heat-sensitive composition of claim 10 wherein said heat-sensitive ionomer is a Class III polymer having the following Structure VIII:

VIII

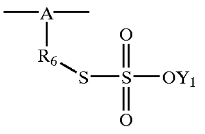

wherein A represents a polymeric backbone, $R_6$ is a divalent linking group, and $Y_1$ is a hydrogen or a cation.

16. The heat-sensitive composition of claim 15 wherein $R_6$ is an alkylene group, an arylene group, an arylenealkylene group, or $—(COO)_{n1}(Z_1)_m$ wherein n1 is 0 or 1, m is 0 or 1, and $Z_1$ is an alkylene group, an arylene group, or an arylenealkylene group, and $Y_1$ is hydrogen, ammonium ion or a metal ion.

17. The heat-sensitive composition of claim 15 wherein $R_6$ is an alkylene group of 1 to 3 carbon atoms, an arylene group of 6 carbon atoms in the aromatic ring, an arylene alkylene group of 7 or 8 carbon atoms in the chain, or $—COO(Z_1)_m$ wherein m is 0 or 1 and $Z_1$ is methylene, ethylene or phenylene.

18. The heat-sensitive composition of claim 1 wherein said heat-sensitive ionomer comprises anionic groups within at least 15 mol % of the polymer recurring units.

19. The heat-sensitive composition of claim 1 wherein said heat-sensitive ionomer is present at from about 1 to about 10 weight %, and said IR dye is present at from about 0.2 to about 1 weight %.

20. A negative-working imaging member comprising a support having disposed thereon a hydrophilic imaging layer prepared from the heat-sensitive composition of claim 1.

21. The imaging member of claim 20 wherein said heat-sensitive ionomer is present in said imaging layer in an amount of at least 0.1 $g/m^2$, and said IR dye is present in said imaging layer in an amount sufficient to provide a transmission optical density of at least 0.1 when exposed to radiation having a $\lambda_{max}$ of 830 nm.

22. The imaging member of claim 20 wherein said support is an on-press printing cylinder.

23. A method of imaging comprising the steps of:

A) providing the negatively-working imaging member of claim 20, and

B) imagewise exposing said imaging member to provide exposed and unexposed areas in the imaging layer of said imaging member, whereby said exposed areas are rendered more hydrophobic than said unexposed areas by heat provided by said imagewise exposure.

24. The method of claim 23 wherein said imagewise exposing is carried out using an IR radiation emitting laser, and said imaging member is a lithographic printing plate having an aluminum support or an imaging cylinder.

25. The method of claim 23 wherein said imagewise exposing is accomplished using a thermal head.

26. A method of printing comprising the steps of:

A) providing the negative-working imaging member of claim 23,

B) imagewise exposing said imaging member to provide exposed and unexposed areas in the imaging layer of said imaging member, whereby said exposed areas are rendered more hydrophobic than said unexposed areas by heat provided by said imagewise exposure, and C) contacting said imagewise exposed imaging member with a lithographic printing ink, and imagewise transferring said printing ink from said imaging member to a receiving material.

27. A method of imaging comprising the steps of:

A) spray coating the heat-sensitive composition of claim 1 onto a support to provide a negative-working imaging member, and B) imagewise exposing said imaging member to provide exposed and unexposed areas in the imaging layer of said imaging member, whereby said exposed areas are rendered more hydrophobic than said unexposed areas by heat provided by said imagewise exposure.

28. The method of claim 27 wherein said support is an on-press printing cylinder or sleeve.

* * * * *